(12) United States Patent
Murakami et al.

(10) Patent No.: US 11,322,331 B2
(45) Date of Patent: May 3, 2022

(54) CHARGED PARTICLE BEAM APPARATUS

(71) Applicant: JEOL Ltd., Tokyo (JP)

(72) Inventors: Yuta Murakami, Tokyo (JP);
Yoshikazu Nemoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 147 days.

(21) Appl. No.: 16/814,293

(22) Filed: Mar. 10, 2020

(65) Prior Publication Data

US 2020/0294761 A1  Sep. 17, 2020

(30) Foreign Application Priority Data

Mar. 15, 2019  (JP) .............................. JP2019-047949

(51) Int. Cl.
*H01J 37/22* (2006.01)
*H01J 37/28* (2006.01)

(52) U.S. Cl.
CPC .......... *H01J 37/226* (2013.01); *H01J 37/224* (2013.01); *H01J 37/28* (2013.01)

(58) Field of Classification Search
CPC ......... H01J 37/224; H01J 37/226; F21K 9/66; F21K 9/68; F21K 9/69
See application file for complete search history.

(56) References Cited

U.S. PATENT DOCUMENTS

| | | |
|---|---|---|
| 4,755,047 A | 7/1988 | Kato et al. |
| 8,345,989 B1 * | 1/2013 | Bresolin .................. G06K 9/00 382/218 |
| 2003/0025087 A1 | 2/2003 | Schamber et al. |
| 2005/0122508 A1 | 6/2005 | Uto et al. |
| 2013/0321906 A1 * | 12/2013 | Kriofske ............ G02B 21/0016 359/363 |
| 2016/0139398 A1 * | 5/2016 | Negishi .................... G01N 1/32 250/453.11 |
| 2019/0317032 A1 * | 10/2019 | Akiyama ............. G01N 23/223 |

FOREIGN PATENT DOCUMENTS

| | | |
|---|---|---|
| JP | 10214583 A | 8/1998 |
| JP | 2005156537 A | 6/2005 |
| JP | 2010225980 A | 10/2010 |
| JP | 2016100111 A | 5/2016 |
| JP | 6335328 B2 | 5/2018 |
| JP | WO2018110265 A1 | 6/2018 |
| KR | 10-2013-0129705 A | 11/2013 |

OTHER PUBLICATIONS

Office Action issued in JP2019047949 dated Feb. 2, 2021.
Partial European Search Report issued in EP20161043.3 dated Jul. 16, 2020.
Extended European Search Report issued in EP20161043.3 dated Oct. 19, 2020.

* cited by examiner

*Primary Examiner* — Eliza W Osenbaugh-Stewart
(74) *Attorney, Agent, or Firm* — The Webb Law Firm

(57) ABSTRACT

An imaging device images a sample holder held by a sample stage. At a front side (target side) of the imaging device, a light emitter device array and a mask array are provided. A plurality of light beams are generated by the light emitter device array. A plurality of center parts of the plurality of light beams are masked by the mask array. A plurality of shadows produced thereby are covered by a plurality of peripheral parts of the plurality of light beams.

5 Claims, 8 Drawing Sheets

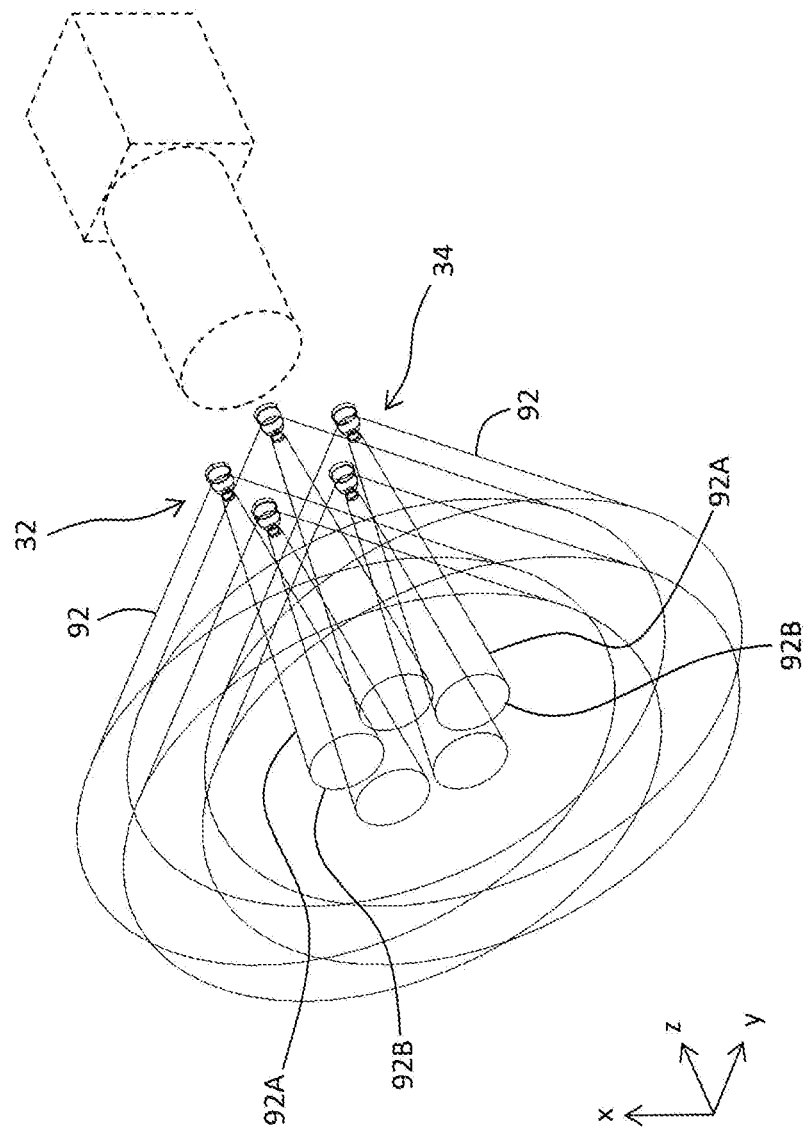

CHARGED PARTICLE BEAM APPARATUS

CROSS REFERENCE TO RELATED APPLICATION

This application claims priority to Japanese Patent Application No. 2019-047949 filed Mar. 15, 2019, the disclosure of which is hereby incorporated by reference in its entirety.

BACKGROUND

Technical Field

The present disclosure relates to a charged particle beam apparatus, and in particular to a charged particle beam apparatus having an imaging device.

Description of Related Art

As charged particle beam apparatuses, there are known a scanning electron microscope, a transmission electron microscope, an ion beam irradiation apparatus, and the like. In the following, a structure of the charged particle beam apparatus will be described while exemplifying the scanning electron microscope.

A scanning electron microscope has a sample holder which holds a sample and an imaging device which images the sample holder. By observing the captured image, a state of the sample can be checked, and a location where an electron beam is to be scanned can be designated on the image. Another type of scanning electron microscope is also known which has a function to combine the captured image and a CG (Computer Graphics) image to generate a reference image representing a state of the sample holder in a sample chamber.

The imaging device is formed from a camera, a lens, or the like. Along with the imaging device, a light source for illuminating a target is provided. The light source is formed from, for example, a plurality of light emitter devices placed around the lens (refer to FIG. 2 of JP 6335328 B). Typically, each light emitter device is formed from an LED (light emitting diode).

JP 2010-225980 A discloses in FIG. 1 an LED lamp. A coating film which functions as a light blocking portion is provided on a surface of a lens unit in the LED lamp. The LED lamp disclosed in this document is for traffic lights, and is not for the charged particle beam apparatus. JP 6335328 B described above does not disclose a light source formed from a plurality of light emitter devices.

In a charged particle beam apparatus, when imaging a target including a sample, normally, a plurality of light emitter devices are provided. When a light emitter device that generates a narrowed light beam is used as each light emitter device, a reflection portion which produces glare; that is, a high-brightness portion obstructing the view, tends to be easily produced on a surface of the target.

This will be described in detail. The holder which holds the sample is normally formed from a metal, and on a surface of the holder, a large number of fine streaks; that is, machining traces (which are also called cutter marks) exist, which are produced during a cutting process of the holder. An illuminance of a center part in each light beam is very high, and the center part is primarily reflected by the machining trace, which is considered to be the cause of the glaring reflection portion. Further, the high-brightness portion may be produced by factors other than the machining trace, or the high-brightness portion may be produced on a surface of the sample. In either case, such a high-brightness portion obstructs observation of the target.

SUMMARY

An advantage of the present disclosure lies in preventing or reducing occurrence of a high-brightness portion on a target surface in a charged particle beam apparatus, when the target is illuminated with a plurality of light beams from a plurality of light emitter devices. Alternatively, an advantage of the present disclosure lies in flattening of a light amount distribution formed by a plurality of light emitter devices, with a simple structure, in a charged particle beam apparatus.

According to one aspect of the present disclosure, there is provided a charged particle beam apparatus comprising: an imaging device that images a target which includes a sample; a plurality of light emitter devices that radiate a plurality of light beams toward the target; and a light distribution adjustment member that has a plurality of light restricting elements placed between the target and the plurality of light emitter devices. Each of the light beams has a center part, and a peripheral part spreading at an outer side of the center part. Each of the light restricting elements restricts an intensity of the center part in each of the light beams.

According to the above-described structure, the center part of the light beam generated by each light emitter device is restricted by each light restricting element. In other words, a light amount or illuminance of the center part is attenuated or is set to zero. With this structure, occurrence of the high-brightness portion on the target surface is reduced or prevented. Because a plurality of light beams are radiated from a plurality of light sources to the target, even when a part of the light amount in each light beam is restricted, an entirety of the target can still be illuminated. In other words, according to the above-described structure, the light amount distribution (or illuminance distribution) can be flattened with a simple structure. In the above-described structure, a part in the light beam which is affected by the light restricting element is the center part, and parts which are not affected are the peripheral portion. Each light restricting element is a physically existing element, and is thus an object.

According to another aspect of the present disclosure, the plurality of light restricting elements are placed in a non-contacting manner and at a position in proximity to the plurality of light emitter devices. When each light restricting element is attached directly to each light emitter device, wear or the like of a transparent cover of the light emitter device tends to be caused, but according to the above-described structure, such a problem does not occur. In general, the light emitter device and the light restricting element may be considered to be in proximity to each other when a distance between each light emitter device and each light restricting element is within a range of 0.5~5 mm. When the distance between the light emitter device and the light restricting element is increased, it becomes necessary to increase the size of each light restricting element, and also, there is a possibility of the plurality of light restricting elements blocking a field of view of the imaging device. Thus, the light emitter device and the light restricting element are desirably placed in proximity to each other.

According to another aspect of the present disclosure, the light distribution adjustment member includes a frame to which the plurality of light restricting elements are integrated. According to this structure, positioning precision of each light restricting element can be improved, and superior assembly operability can be achieved.

According to another aspect of the present disclosure, the frame includes an outer ring, and an inner ring provided at an inner side of the outer ring. The light distribution adjustment member further includes a plurality of bridges which connect the outer ring and the inner ring. Each of the bridges functions as an entirety or a part of each of the light restricting elements. According to this structure, because each bridge is held in a doubly-held manner by the two rings, a position and an orientation of each bridge can be stabilized. That is, even when the thickness of each ring or each bridge is reduced, a sufficient level of form stability can be easily achieved.

According to another aspect of the present disclosure, the charged particle beam apparatus further comprises a substrate on which the plurality of light emitter devices are mounted. A plurality of arms are provided on the frame, and the plurality of arms are fixed with respect to the substrate. According to this structure, placement of the light distribution adjustment member at a suitable position and a suitable orientation with respect to the plurality of light emitter devices can be facilitated.

According to another aspect of the present disclosure, a plurality of shadows are produced by the plurality of light restricting elements on a virtual irradiation plane orthogonal to a center axis of observation of the imaging device, and the plurality of peripheral parts of the plurality of light beams cover the plurality of shadows. According to this structure, the plurality of shadows which may be produced by the plurality of light restricting elements on the irradiation surface can be reduced or substantially resolved. The irradiation surface may be conceptualized as a virtual surface including a surface of the target (for example, an upper surface of the sample holder).

According to another aspect of the present disclosure, an imaging position is set adjacent to a sample chamber which houses the target, and the imaging device, the plurality of light emitter devices, and the light distribution adjustment member are provided at an upper part of the imaging position. According to this structure, for example, a target which is oriented in an upward direction can be easily imaged before the target is introduced into the sample chamber. In this case, the occurrence of the high-brightness portion on the target surface is prevented or suppressed. Thus, quality of the captured image can be improved. In the embodiment, the image is a still image, but alternatively, a moving image may be captured.

BRIEF DESCRIPTION OF DRAWINGS

Embodiment(s) of the present disclosure will be described based on the following figures, wherein:

FIG. 6 is a perspective diagram showing overlapping of a plurality of light beams;

DESCRIPTION OF EMBODIMENTS

An embodiment of the present disclosure will now be described with reference to the drawings.

Figure 1:
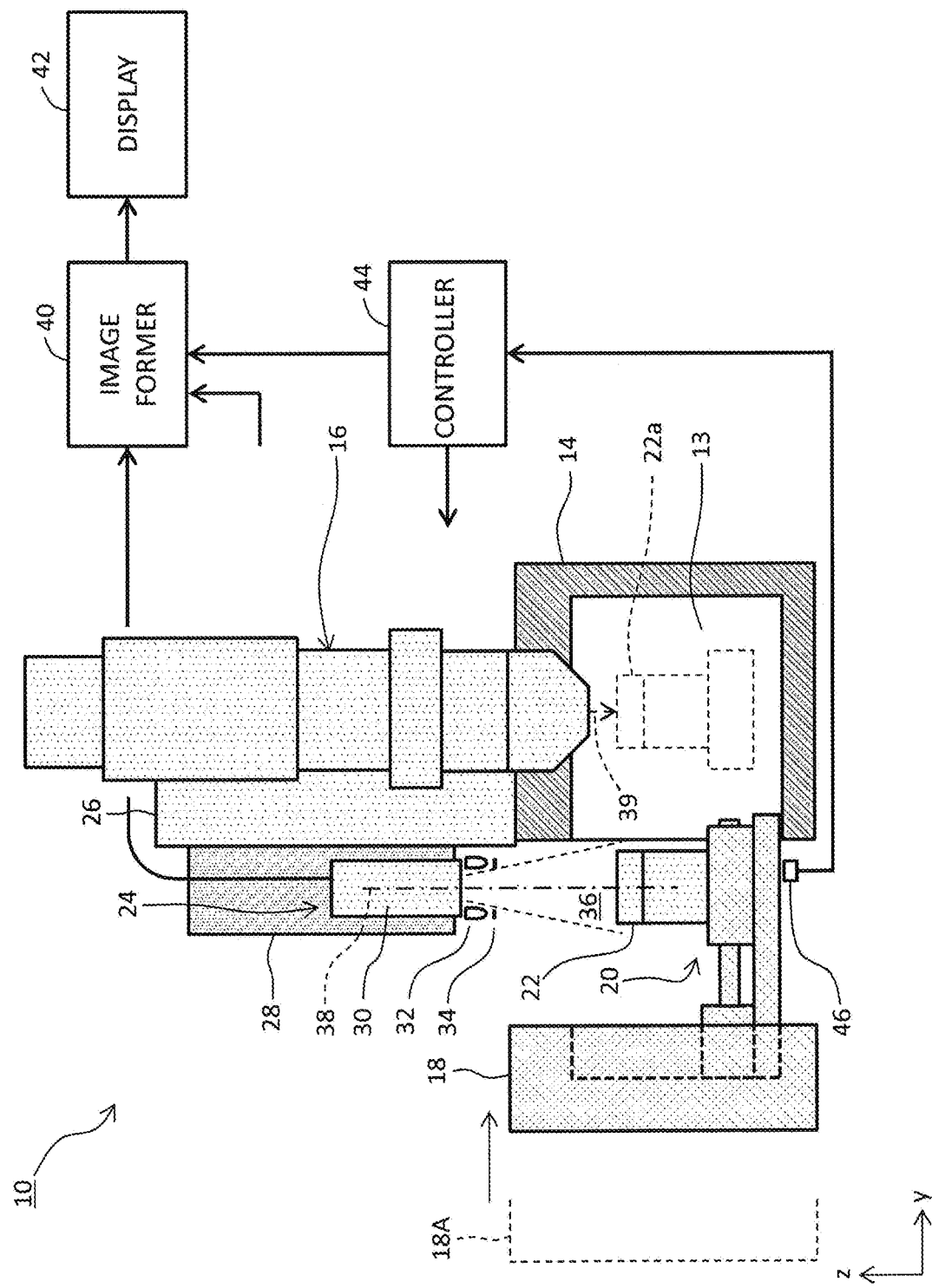
FIG. 1 is a schematic diagram showing a scanning electron microscope according to an embodiment of the present disclosure.

FIG. 1 shows a charged particle beam apparatus according to an embodiment of the present disclosure. The illustrated charged particle beam apparatus is a scanning electronic microscope (SEM) 10, and is schematically shown in FIG. 1. Alternatively, the structures described below may be applied to apparatuses other than the scanning electron microscope.

The scanning electron microscope 10 has a measurement unit and an information processor. Alternatively, the measurement unit and the information processor may be separate entities. The measurement unit comprises a sample chamber 13, a lens barrel 16, an imaging unit 24, or the like. The information processor comprises an image former 40, a display 42, a controller 44, or the like. The scanning electron microscope 10 is placed, for example, on a desk or a table. A y direction is a first horizontal direction, and an x direction orthogonal to the y direction is a second horizontal direction. A z direction is a vertical direction (perpendicular direction) orthogonal to the x direction and the y direction.

A sample to be observed is housed in the sample chamber 13. Specifically, the sample is held by a sample holder 22. In FIG. 1, a sample holder placed in the sample chamber 13 is shown by reference numeral 22*a*. The lens barrel 16 is formed from an electron gun, a deflection scanning coil, an objective lens, or the like. With the lens barrel 16, an electron beam 39 is formed, and is radiated onto the sample. The electron beam 39 is two-dimensionally scanned. In FIG. 1, illustrations of a backscattered electron detector, a secondary electron detector, or the like are omitted.

The sample chamber 13 is surrounded by a housing 14 formed from a metal member. When a door 18 is moved in the y direction, the housing 14 and the door 18 are combined, so that a tightly sealed space is formed in the sample chamber 13. During observation of the sample, a pressure of the sample chamber 13 is reduced, and the sample chamber 13 becomes a vacuum chamber. The door 18 slides in the y direction with respect to the housing 14, and a sliding mechanism (not shown) is provided for this purpose.

A sample stage 20 is provided on the door 18. The sample stage 20 comprises a z-direction movement mechanism, an x-direction movement mechanism, and a y-direction movement mechanism. Further, as a part of the sample stage 20, a rotation mechanism, a tilt mechanism, or the like may be provided. The sample holder 22 is held by the sample stage 20.

The sample holder 22 is formed from, for example, a frame member having a circular recess, a circular disk-shaped block which is fitted to the recess, a plurality of plates placed in a plurality of small holes formed in the block, or the like. An individual sample (that is, an individual element forming the sample) is provided on a surface of each plate. This structure, however, is merely exemplary.

The sample holder 22 is held in an upward-directed orientation by the sample stage 20. When the sample stage 20 has a tilt mechanism or the like, the sample holder 22 is set in the upward orientation at least during opening and closing of the door 18. In the present embodiment, an imaging position is set within a slide movement range of the door 18, and, when a center of the sample holder 22 is positioned at the imaging position, an upper surface of the sample holder 22 is imaged. This process will be described later in detail. The door 18 and the sample stage 20 form a movable element or a slide movement element as a whole.

In the illustrated example structure, a tower 26 is fixed at an upper part of the housing 14, and a frame 28 is fixed with respect to the tower 26. The imaging unit 24 is fixed in a downward-directed orientation with respect to the frame 28. The frame 28 also functions as a heat dissipation plate for dissipating heat generated in the imaging unit to the outside environment. In FIG. 1, the imaging unit 24 is schematically shown.

The imaging unit 24 has an imaging device 30, a light emitter device array 32, and a mask array 34. The imaging device 30 is formed from a camera and a lens system. The light emitter device array 32 functions as a light source, and, in the present embodiment, the light emitter device array 32 is formed from a plurality of light emitter devices, more specifically, 5 light emitter devices, arranged in a ring shape. The number of light emitter devices may be increased or decreased. The mask array 34 is provided on a front surface side of the light emitter device array 32; that is, below the light emitter device array. The mask array 34 comprises a plurality of masks (light blocking units) provided proximate to and in front of the light emitter device array 32. Each mask functions as a light restricting element. In the present embodiment, as will be described later, the mask array 34 is formed as a part of a mask plate. The mask plate functions as a light distribution adjustment member.

In FIG. 1, a field of view 36 of the imaging device 30 is a region spreading in the x direction and in the y direction from a center axis of imaging 38. The upper surface of the sample holder 22 positioned at the imaging position is contained in the field of view 36. When the sample holder is positioned at the imaging position, a center axis of the sample holder coincides with the center axis of imaging 38. Reference numeral 18A shows the door at a rear-movement end.

The image former 40 is a module which forms an image based on an output signal from the imaging unit 24, and processes the image as necessary. The formed or processed image is displayed on the display 42. Alternatively, at the image former 40, a reference image showing a position and an orientation of the sample holder in the sample chamber 13 may be combined. In this case, the captured image and a CG image may be combined to generate the reference image. Alternatively, a location where the electron beam is to be scanned may be designated on the reference image. On the display 42, an SEM image formed by scanning of the electron beam is displayed. In FIG. 1, structures related to the SEM image are not shown.

The controller 44 controls operations of the elements of the scanning electron microscope. The controller 44 controls an operation of the imaging unit 24. Specifically, lighting and shutting-off of the light of the light emitter device array 32, and imaging by the camera are controlled by the controller 44.

In the present embodiment, during a process in which a movable element formed from the door 18 and the sample stage 20 is slide-moved in the y direction (to the right in FIG. 1), when a position of the movable element coincides with a predetermined imaging position, imaging of the sample holder 22 by the imaging unit 24 is automatically executed. For this purpose, a sensor 46 is fixedly placed at a lower part of the housing 14. The sensor 46 is formed from, for example, a photointerrupter sensor, a micro-switch, a magnetic sensor, or the like. With the sensor 46, when the slide position of the movable element coincides with the imaging position, a detection signal is output from the sensor 46. The controller 44 operates and lights the light emitter device array 32 at a timing when the detection signal is output, and causes the camera to perform imaging. Alternatively, the imaging may be executed based on a manual instruction.

In the present embodiment, each light emitter device of the light emitter device array 32 is formed from a white light emitting element (white LED). A light beam formed by such a light emitting element is in general sharp, and, in particular, illuminance thereof is high near a center axis of the light beam. The sample holder 22 is in general formed from a metal, and a cutting trace caused during cutting machining exists on a surface of the sample holder 22. When the center part of the light beam having a high illuminance is illuminated on the cutting trace, high brightness reflection light which produces glare tends to be more easily produced at this section. That is, when the sample holder is imaged by the camera, one or a plurality of high brightness portions tend to be easily produced in the resulting image. These high brightness portions obstruct observation of the target.

In order to solve or reduce such a problem, the mask array 34 described above is provided. The illuminance or an amount of light of the center part of each light beam is reduced by the mask array 34. This structure will be described below with reference to FIG. 3 and subsequent figures.

Figure 2:
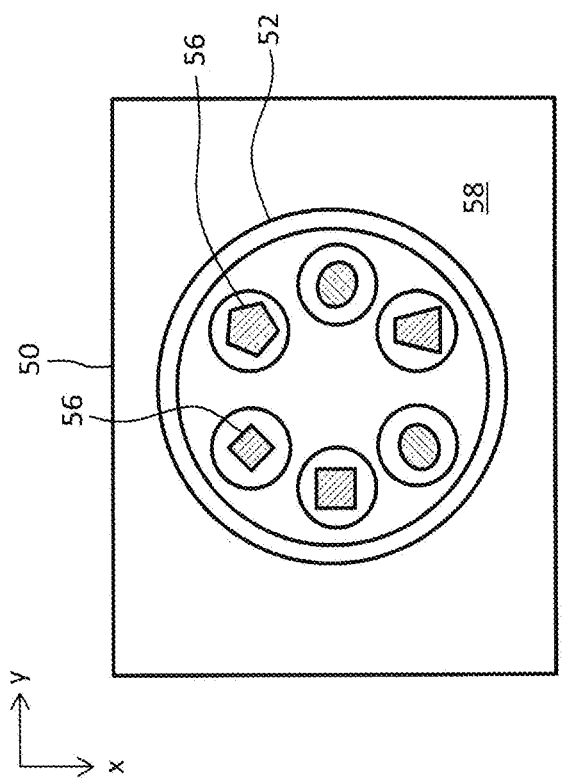
FIG. 2 is a diagram showing an image captured by an imaging unit.

FIG. 2 shows an image 50 (a still image) captured by the imaging unit. The image 50 includes a holder image 52. The holder image 52 includes a plurality of individual sample images 56. An outer region 58 of the holder image 52 is removed by a trimming process as necessary. For example, the image after this process is combined with a CG image.

Figure 3:
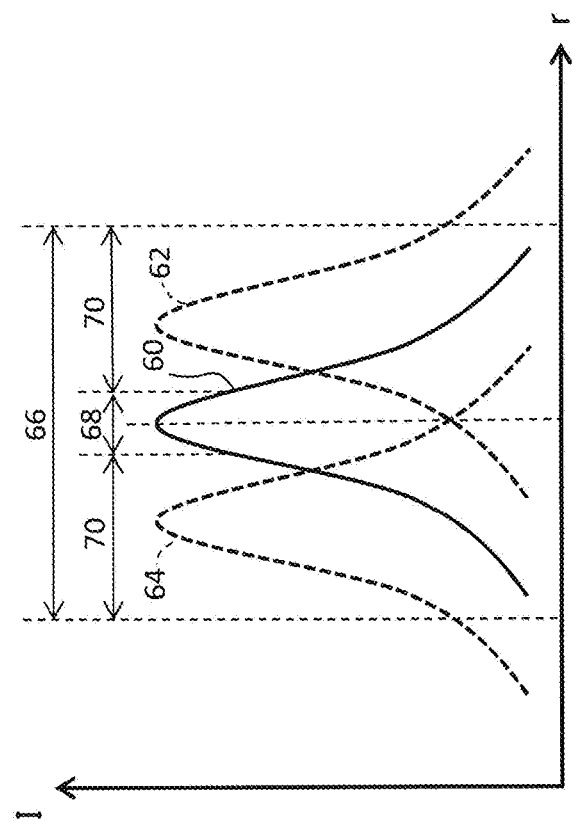
FIG. 3 is a characteristic diagram showing overlapping of a plurality of light beams.

FIG. 3 shows a plurality of light beam profiles 60, 62, and 64 arranged on an r axis. A vertical axis shows an amount of light or illuminance. As will be shown later, in the present embodiment, the plurality of light beams have a ring-shaped arrangement, but FIG. 3 shows, for the purpose of explanation, the three light beam profiles 60, 62, and 64 corresponding to three light beams which are one-dimensionally arranged. Each of the light beam profiles 60, 62, and 64 has a mountain-shaped form, with a highest intensity at a beam center and the intensity continuously reduced as the position moves away from the beam center in a left-and-right direction (peripheral direction). The base of the mountain spreads in the left-and-right direction.

Here, with regard to the light beam profile 60, a full width 66 of the light beam profile 60 has a center part 68 and peripheral part 70 other than the center part 68. The high-brightness portion described above is produced primarily by the center part 68. Thus, in the present embodiment, a plurality of masks serving as a plurality of light blocking units are placed in front of the plurality of light emitter devices, as described below.

Figure 4:
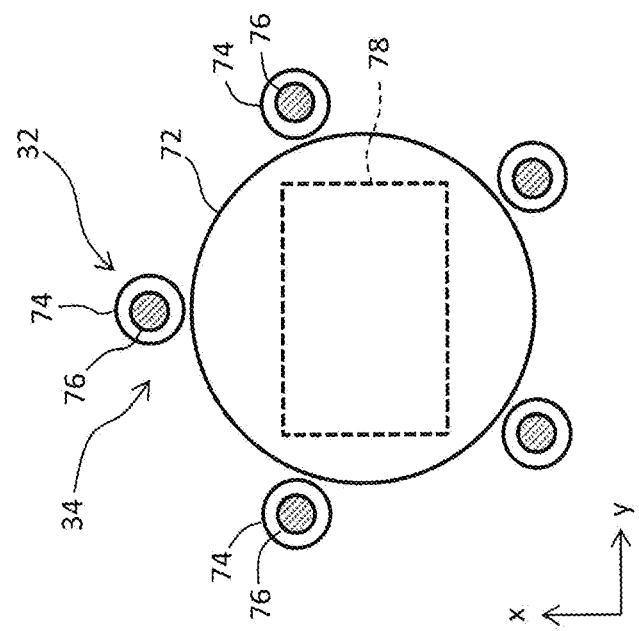
FIG. 4 is a diagram showing a mask array provided corresponding to a light emitter device array.

FIG. 4 shows front sides of the light emitter device array 32 and the mask array 34. The light emitter device array 32 is formed from 5 light emitter devices 74 arranged in an annular shape around a lens end surface 72. As described above, each light emitter device 74 is formed from a white light emitting element. The mask array 34 is formed from 5 masks 76 arranged in an annular shape similar to that formed by the 5 light emitter devices 74 described above. Each mask 76 is formed from, for example, a member (for example, a metal) which completely blocks a center part of the light beam. Alternatively, as each mask 76, a semi-transparent member which attenuates the light may be provided. Alternatively, as each mask 76, a member in which the light attenuation action changes continuously or stepwise from the center thereof toward the periphery thereof may be provided. Reference numeral 78 schematically shows an imaging area of the camera.

Figure 5:
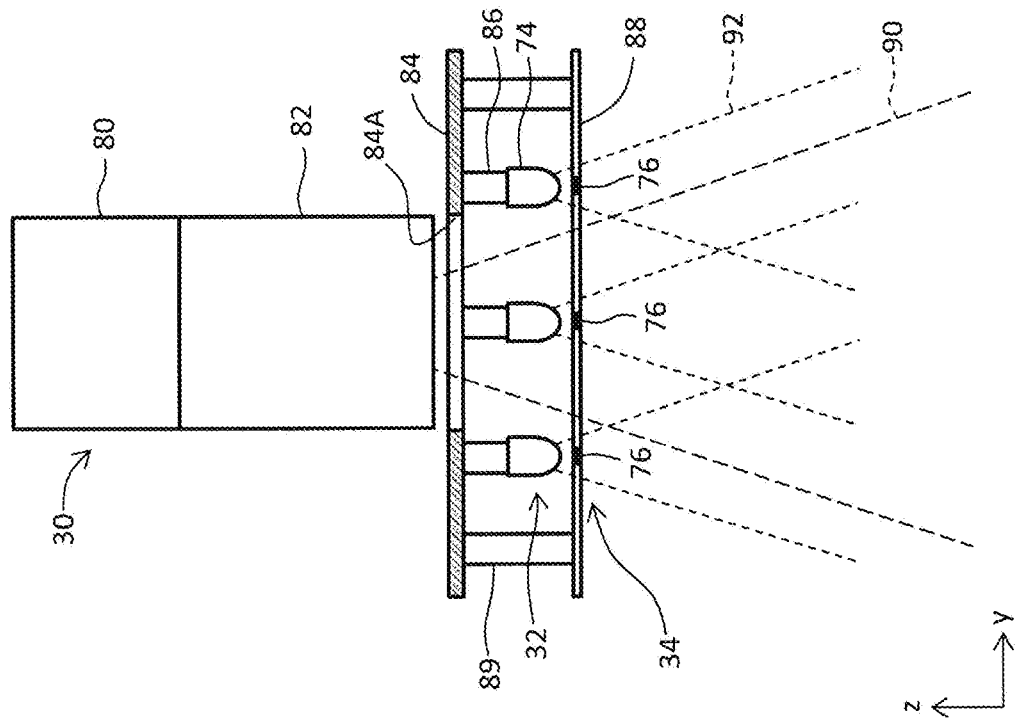
FIG. 5 is a side view of an imaging unit.

FIG. 5 shows a side of the imaging unit. The imaging device 30 is formed from a camera 80, and a lens system 82 provided at a front side of the camera 80. The camera 80 is, for example, a CCD camera. A substrate 84 is provided at a front side (side of imaging target) of the lens system 82, and the light emitter device array 32 is placed on the substrate 84. The plurality of light emitter devices 74 of the light emitter device array 32 are fixed on the substrate 84 with a plurality of spacers 86 therebetween. An opening 84A is formed on the substrate 84.

At a front side of the substrate 84, a mask plate 88 is provided. The mask plate 88 is a thin metal plate, and includes the plurality of masks 76. The mask plate 88 is attached to the substrate 84 in parallel to the substrate 84, with a pair of support pillars 89 therebetween. In this manner, a positioning precision of the mask array 34 with respect to the light emitter device array 32 is improved. FIG. 5 also shows a relationship between a field of view 90 and a plurality of light beams 92. Alternatively, the mask plate may be formed by a member other than that made of a metal, such as a resin or the like. A diameter of the lens end surface is, for example, within a range of 2~5 cm. A diameter (outer diameter) of a transparent cover portion of the light emitting element is, for example, within a range of a few to 10 mm. A diameter of each mask is, for example, a few mm. A distance between the light emitter device array 32 and the mask array 34 is set, for example, within a range of 0.5 mm to 5 mm. Desirably, the distance is set within a range of 1.0 mm to 1.5 mm.

FIG. 6 shows a plurality of light beams. Five light beams 92 are formed by the light emitter device array 32. The light beams overlap each other in a multiplexed manner. In particular, the light beams overlap each other in a multiplexed manner at the periphery parts. On a virtual imaging plane spreading in the x direction and the y direction orthogonal to the center axis of imaging, the 5 irradiation areas overlap each other.

The mask array 34 restricts passage of 5 center parts included in the 5 light beams, and allows passage of 5 peripheral parts included in the 5 light beams. The 5 parts for which passage is restricted are shown by reference numeral 92A. In correspondence to these parts, on the irradiation surface, 5 circular shadows 92B are produced. The 5 circular shadows do not overlap each other, and have a ring-shaped arrangement. Each shadow 92B is covered by the peripheral parts of other 4 beams, and, practically, each shadow 92B is not produced. With this process, the illuminance is made uniform over the entire irradiation surface. As a result, the high-brightness portion produced at the center part of each light beam in association with the machining trace is significantly suppressed. According to the present embodiment, such a superior result can be achieved with a simple structure.

Next, with reference to FIGS. 7 to 10, a first example through a fourth example of the mask plate serving as the light distribution adjustment member will be described.

Figure 7:
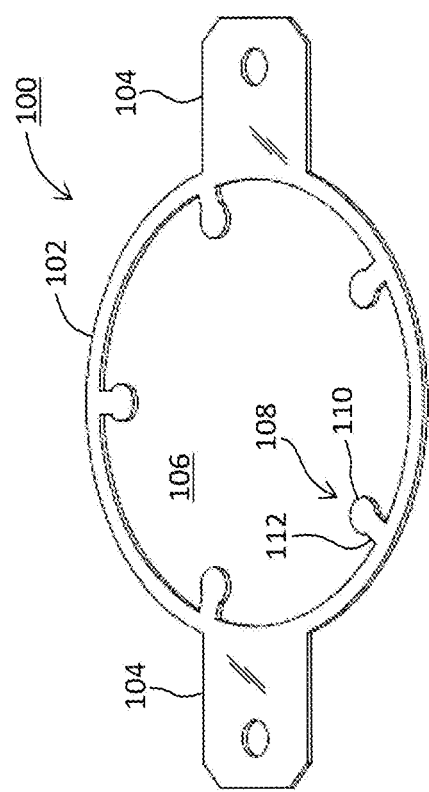
FIG. 7 is a diagram showing a first example of a mask plate.

FIG. 7 shows a mask plate 100 according to the first example. The mask plate 100 includes a ring-shaped frame 102, 5 protrusions 108 held on the frame 102, and a pair of arms 104 provided on the frame 102. These elements are integrated, and the mask plate 100 is made of a single member.

The mask plate is formed from, for example, a metal such as aluminum, stainless steel, or the like. Alternatively, the mask plate may be formed from other nontransparent materials. Alternatively, a black treatment may be applied on the surface of the mask plate 100, or the mask plate 100 may be formed from a black material.

Each protrusion 108 protrudes in a center direction; that is, toward an inner side, of the frame 102. Each protrusion 108 includes a circular portion 110 which functions as a mask; that is, a light blocking unit, and a connecting band 112 connecting the circular portion 110 to the frame. On each arm 104, a screw hole which is used when the arm is fixed on the support pillar is formed. When the mask plate 100 of the first example is employed, in general, in order to increase rigidity of the mask plate 100 as a whole, a lateral width or a thickness of the frame 102 must be set large to a certain degree.

Figure 8:
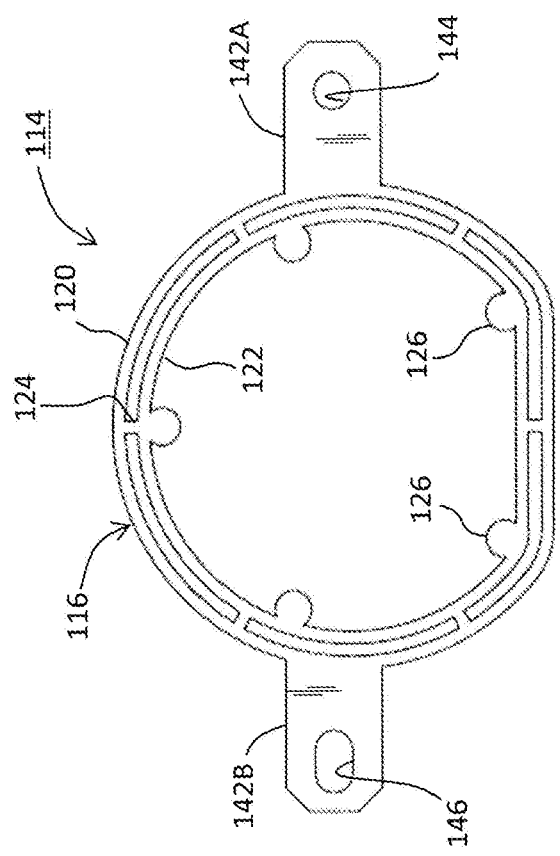
FIG. 8 is a diagram showing a second example of a mask plate.

FIG. 8 shows a mask plate 114 according to the second example. The mask plate 114 includes an approximately circular frame 116, 5 small circular portions 126 provided at an inner side of the frame 116, and a pair of arms 142A and 142B provided at an outer side of the frame 116. The frame 116 is formed from an outer ring 120, and an inner ring 122 provided at an inner side of the outer ring 120. A plurality of connecting bands 124 are provided between the outer ring 120 and the inner ring 122, and the outer ring 120 and the inner ring 122 are integrated with each other by the connecting bands 124. Slits are formed between the plurality of connecting bands 124. The plurality of small circular portions 126 function as the plurality of masks. A portion of the outer ring 120 and a portion of the inner ring 122 also practically function as the mask, but so long as a sufficient illumination action can be realized by the plurality of light beams as a whole, such a practical mask action does not cause a problem.

According to the second example, in comparison to the first example, an amount of material of the mask plate 114 can be reduced while securing the rigidity of the frame 116. Because each small circular portion 126 is integrated with the inner ring 122 over a relatively wide range, an orientation and a position of each small circular portion 126 can be easily maintained. However, for the small circular portion 126, because a singly-held method is employed, when the thickness of the mask plate 114 is reduced, it becomes easier for the orientation of each small circular portion 126 to change.

A circular opening 144 is formed on the arm 142A, and an opening 146 is formed as a long hole on the arm 142B. A direction of extension of the opening 146 is a direction of arrangement of the arms 142A and 142B. With this configuration, the side of the opening 144 may be provisionally fixed by screwing, and the arm 142B at the opposite side may be moved, so that the position of the mask plate 114 in the horizontal direction can be easily adjusted. After the adjustment, the side of the opening 144 is screwed and fixed, and the side of the opening 146 is also screwed and fixed. Alternatively, a configuration may be employed to allow adjustment of the position of the mask plate in both the x direction and the y direction, or to allow adjustment of a rotational angle of the mask plate 114 around a plate center axis parallel to the z direction.

Figure 9:
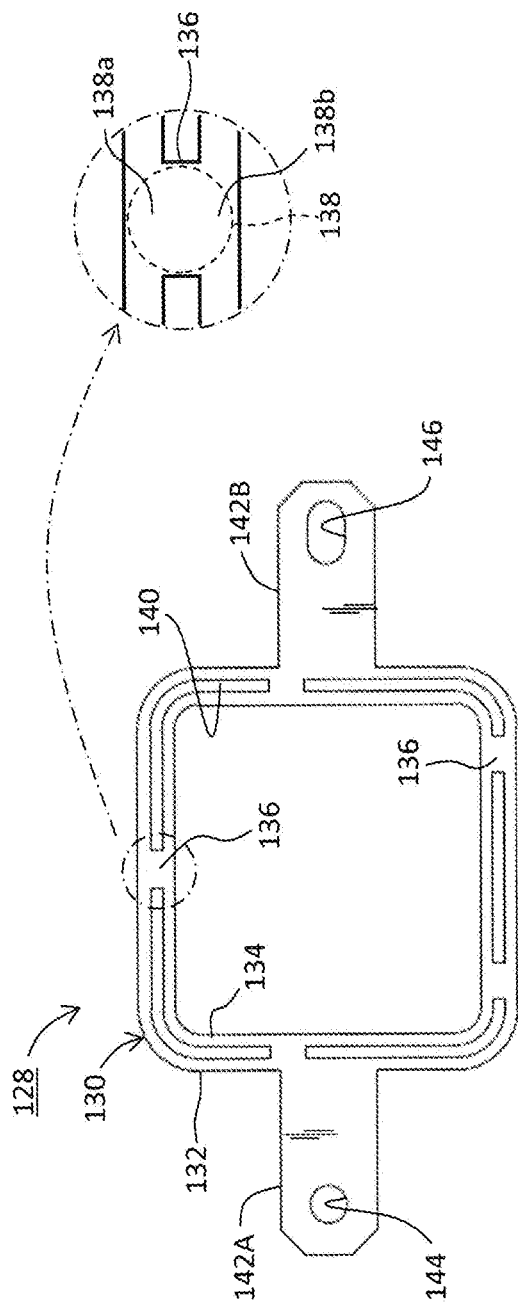
FIG. 9 is a diagram showing a third example of a mask plate.

FIG. 9 shows a mask plate 128 according to the third example. Similar to the first example and the second example, the mask plate 128 is formed as a single metal plate having a uniform thickness. More specifically, the mask plate has a frame 130. The frame 130 has an outer ring 132 and an inner ring 134. A plurality of bridges 136 are provided between the outer ring 132 and the inner ring 134. The outer ring 32 and the inner ring 134 are integrated via the plurality of bridges 136.

Each bridge 136 functions as a connecting section or a conjunction section, and has a quadrangular shape. Each local region 138 including each bridge 136 functions as the mask. Each local region 138 is formed from the bridge 136 and portions 138a and 138b connected therefrom. The portion 138a is a part of the outer ring 120, and the portion 138b is a part of the inner ring 122. Each local region 138 is a region which restricts an amount of light of the center part which produces the high-brightness portion.

In the illustrated example configuration, a lateral width a (a width in the frame extension direction, and a width in a direction orthogonal to the ring arrangement direction) of each bridge 136 and a lateral width b (a width in a direction orthogonal to the frame extension direction, and a width in the ring arrangement direction) of the frame 130 are substantially equal to each other, and match the size of the center part. That is, the lateral width of the frame 130 is significantly small, and the amount of material of the frame 130 is thus reduced. With reference to either a or b, when the difference between a and b is, for example, within 10%, a and b may be considered to be equal.

Portions of the frame 130 other than the local portion also practically function as the mask, but this does not cause a problem, as already described above. Alternatively, the light blocking of each center part may be achieved only by each bridge 136. A plurality of slits 140 are formed between the plurality of bridges 136, and the amount of material of the frame 130 is thus reduced. Further, the illuminance is improved by the light passing through the plurality of slits 140.

The outer ring 132 and the inner ring 134 has a rectangular form avoiding the substantial field of view (imaging area) and surrounding an outer side of the substantial field of view. A pair of arms 142A and 142B are provided on the outer ring 132. The openings 144 and 146 described with reference to FIG. 8 are formed in these arms (on the figures, the positions thereof are exchanged).

According to the third example, while the rigidity of the mask plate 128 is secured, the amount of material can be significantly reduced. In this case also, each bridge 136 which is the primary portion of each mask is held by the two rings 132 and 134 in a doubly-held manner, and thus, an orientation and a position of each bridge 136 can be maintained. The light beam is blocked also by portions not intended to act as the mask, but disruption of the light distribution caused thereby can be ignored. According to the third example, the amount of material can be reduced, generation of the high-brightness portion can be prevented, and uniform light distribution can be obtained.

Figure 10:
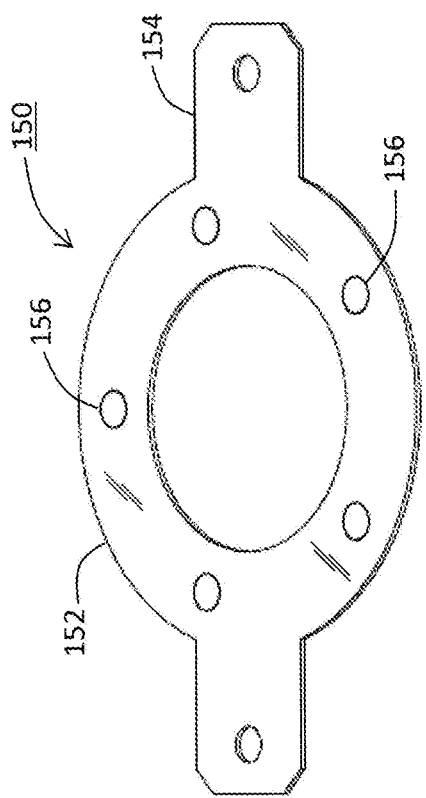
FIG. 10 is a diagram showing a fourth example of a mask plate.

FIG. 10 shows a mask plate 150 according to the fourth example. The mask plate 150 includes a body 152, which is formed from a transparent member. For example, the body 152 is formed from a resin having transparency. The body 152 has two arms 154. A plurality of light blocking patches 156 are provided on a ring-shaped portion of the body 152. Each light blocking patch 156 is formed from a black seal, a coating, or the like. The plurality of light blocking patches 156 function as the plurality of light blocking units; that is, the plurality of masks. According to this configuration, while the center part of each light beam is locally blocked, the passage of the peripheral part of each light beam is completely allowed.

In the embodiment described above, each mask is formed as a nontransparent portion. Alternatively, for example, each mask may be formed from a member having a transmittance of 30%. Further alternatively, each mask may be formed in such a manner that the restricting characteristic varies corresponding to an illuminance profile.

The invention claimed is:

1. A charged particle beam apparatus comprising:
   an imaging device that images a target which includes a sample;
   a plurality of light emitter devices that radiate a plurality of light beams toward the target; and
   a light distribution adjustment member that has a plurality of light restricting elements placed between the target and the plurality of light emitter devices, wherein
   each of the light beams has a center part and a peripheral part spreading at an outer side of the center part,
   each of the light restricting elements restricts an intensity of the center part in each of the light beams,
   the light distribution adjustment member includes a frame to which the plurality of light restricting elements are integrated,
   the frame includes an outer ring and an inner ring provided at an inner side of the outer ring,
   the light distribution adjustment member further includes a plurality of bridges which connect the outer ring and the inner ring, and
   each of the bridges functions as an entirety or a part of each of the light restricting elements.

2. The charged particle beam apparatus according to claim 1, wherein
   the plurality of light restricting elements are placed in a non-contacting manner and at a position in proximity to the plurality of light emitter devices.

3. The charged particle beam apparatus according to claim 1, wherein
   a plurality of shadows are produced by the plurality of light restricting elements on a virtual irradiation plane orthogonal to a center axis of observation of the imaging device, and the plurality of peripheral parts of the plurality of light beams cover the plurality of shadows.

4. The charged particle beam apparatus according to claim 1, wherein
   an imaging position is set adjacent to a sample chamber which houses the target; and
   the imaging device, the plurality of light emitter devices, and the light distribution adjustment member are provided at an upper part of the imaging position.

5. A charged particle beam apparatus comprising:
   an imaging device that images a target which includes a sample;
   a plurality of light emitter devices that radiate a plurality of light beams toward the target; and
   a light distribution adjustment member that has a plurality of light restricting elements placed between the target and the plurality of light emitter devices, wherein
   each of the light beams has a center part and a peripheral part spreading at an outer side of the center part,
   each of the light restricting elements restricts an intensity of the center part in each of the light beams,
   the light distribution adjustment member comprises a frame having an outer ring and an inner ring that are integrated via a plurality of bridges provided between the outer ring and inner ring.

* * * * *